(12) United States Patent
Satoh et al.

(10) Patent No.: US 7,028,390 B2
(45) Date of Patent: Apr. 18, 2006

(54) ELECTRONIC PARTS INSTALLATION DEVICE AND CASSETTE CONTROL DEVICE

(75) Inventors: Hiroshi Satoh, Higashi Yatsushiro-gun (JP); Hiroshi Uchiyama, Koufu (JP); Hirofumi Obara, Nakakoma-gun (JP)

(73) Assignee: Matsushita Electric Industrial Co., Ltd., Kadoma (JP)

( * ) Notice: Subject to any disclaimer, the term of this patent is extended or adjusted under 35 U.S.C. 154(b) by 609 days.

(21) Appl. No.: 10/233,665

(22) Filed: Sep. 4, 2002

(65) Prior Publication Data

US 2004/0040147 A1    Mar. 4, 2004

(51) Int. Cl.
*B23P 19/00*    (2006.01)

(52) U.S. Cl. .................. 29/739; 29/33 M; 29/740; 700/59

(58) Field of Classification Search ............. 29/33 M, 29/739, 740, 741; 700/59
See application file for complete search history.

(56) References Cited

U.S. PATENT DOCUMENTS

| | | | | |
|---|---|---|---|---|
| 5,060,366 A | * | 10/1991 | Asai et al. | 29/739 |
| 5,235,739 A | * | 8/1993 | Pedall | 29/740 |
| 5,495,661 A | * | 3/1996 | Gromer et al. | 29/740 |
| 5,588,195 A | * | 12/1996 | Asai et al. | 29/33 M |
| 6,154,954 A | * | 12/2000 | Seto et al. | 29/740 |
| 6,374,146 B1 | * | 4/2002 | Oyama et al. | 700/59 |
| 6,725,532 B1 | * | 4/2004 | Okada et al. | 414/752.1 |

* cited by examiner

*Primary Examiner*—Carl J. Arbes
(74) *Attorney, Agent, or Firm*—Steptoe & Johnson LLP

(57) ABSTRACT

A cassette control device by which high-speed processing can be expected even by using an arithmetical unit with current processing capability, even when the number of cassettes increases simultaneously with an increase in the number of nozzles which can suck electronic parts. There is provided storage unit (18) having storage regions in which programs for respective operation patterns of the cassettes (3-1 to 3-M) are set for each of the nozzles. An arithmetic unit (19) extracts a specific program required for driving in a specific operation pattern based on a command (17) inputted according to the content of packaging, from a specific region which is provided in the storage unit (18) to correspond to a specific nozzle to be used, and the arithmetic unit (19) operates the specific cassette using the specific program.

5 Claims, 11 Drawing Sheets

ELECTRONIC PARTS INSTALLATION DEVICE AND CASSETTE CONTROL DEVICE

BACKGROUND OF THE INVENTION

1. Field of the Invention

The present invention relates to an electronic parts installation device for mounting electronic parts such as a fine chip part and a large integrated circuit device on a printed board. To be specific, the present invention concerns a cassette control device which operates cassettes for supplying the electronic parts to parts taking-out positions.

2. Description of the Related Art

FIGS. 9 to 11 show a conventional electronic parts installation device.

As shown in FIG. 11, an electronic parts installation device 7, which mounts electronic parts on a printed board 13 serving as a work, includes a head 8 attached on a robot arm 9 and a cassette group 11 for supplying electronic parts. At mounting positions ST1 to STM of the cassette group 11, a plurality of first to Mth cassettes (3-1), (3-2), . . . , and (3-M) are set in order from an end in such a way as to supply multiple kinds (=M) of parts to the head 8.

Among parts supplied to parts taking-out positions P1 of the first to Mth cassettes (3-1) to (3-M), necessary parts are sucked by sucking nozzles q2 of the head 8. The head 8 which sucks and holds the parts is driven and carried to a target mounting position of the printed board 13 by the robot arm 9, and the head 8 mounts the parts thereon.

The attitudes and shapes of the parts are checked by a recognizing device 10 during the driving and carrying operation until when the electronic parts are sucked and held by the head 8 and reach the target mounting position of the printed board 13. At this moment, when it is judged that an electronic part sucked by the sucking nozzle q2 is defective in shape, the part is discarded in a disposal unit 12.

FIG. 10 shows a fundamental configuration of the first to Mth cassettes (3-1) to (3-M). Each of the cassettes includes a mechanism section 5 and a control section 6.

The mechanism section 5 is constituted by a reel (5-3) for winding and storing a carrier tape R, on which parts to be supplied are packaged at predetermined intervals, and a carrying/unpacking section (5-2) which intermittently drives the carrier tape R taken out from the reel (5-3) toward the parts take-out positions P1 and unpacks component storing parts of the carrier tape R so that the sucking nozzles q2 suck and hold target parts stored in the component storing parts. Further, the carrying/unpacking section (5-2) has a cylinder device as a power source, and the carrying/unpacking section (5-2) is provided with a valve V for turning on/off the passage of compressed air for operating the cylinder device.

The control section 6 is constituted by a valve control section (6-2), which operates the valve V based on an instruction from the cassette control device 2 placed on the outside of the cassette, and a connector (6-1), which connects the cassette control device 2 and the valve control section (6-2) to transmit and receive signals.

To be specific, with respect to the operations of the cassettes (3-1) to (3-M) are performed as below, the connector (6-1) receives a command of operating the valve from the cassette control device 2, and the valve control section (6-2) turns on/off the valve V. The timing of turning on/off the valve V is controlled by two sensors a and k mounted on the valve control section (6-2). The valve V is turned on by the valve control section (6-2), and at the completion of transfer of parts in the carrying/unpacking section (5-2), the first sensor a is turned on and the valve V is turned off. After the valve V is turned off, the valved V is turned on again when the parts are taken out. When the carrying/unpacking section (5-2) returns to the original position, the second sensor b is turned on and the operation is completed.

Besides, of the cassettes (3-1) to (3-M), for some specific cassettes where parts are taken out by the sucking nozzles q2, it is necessary to provide operation commands for supplying another parts to the parts take-out positions P1. The contents of the operation command are different depending upon the shape of a handled part and the shape of the carrier tape for packaging the handled part.

As shown in FIG. 9, the conventional cassette control device 2 is constituted by sequence arithmetic means 15 for recognizing instruction information 14 supplied from a host controller 4, and storage means 16 in which programs are written.

If a plurality (=K) of operation patterns are available for each of the cassettes (3-1) to (3-M), programs for the plurality (:K) of operation patterns are written for each of the cassettes in the storage means 16. (M*K) programs are written in total.

Here, the contents of the instruction information 14 supplied from the host controller 4 consist of at least three items as follows:

Which cassette (specific cassette) of the first to Mth cassettes (3-1) to (3-M) stores a target part Which nozzle is used to take out the target part of the specific cassette Which operation pattern is used to operate the specific cassette The sequence arithmetic means 15 using the instruction information 14 as input information searches regions of each cassette of the storage means 16 and operates the specific cassettes according to operation pattern programs of the search result every time a target part of a specific cassette is taken out by the sucking nozzle.

In recent electronic parts installation devices, the sucking nozzles q2 mounted on the head 8 has increased in number to enhance production efficiency. Accordingly, the total number (=M) of cassettes mounted in the cassette group 11 has also increased.

In the conventional cassette control device 2, every time one cassette is added, one region where K operation pattern programs are written is added in the storage means 16. Thus, the storage means 16 requires a larger capacity.

Moreover, since the inexpensive sequence arithmetic means 15 with low capability is adopted, at selection of a program required to operate a specific cassette according to a target operation pattern, all the regions of the storage means 16 are always scanned in the same order to obtain a program required to operate the necessary specific cassette. Thus, the scanning requires a long time and high-speed processing is demanded under the current circumstances.

SUMMARY OF THE INVENTION

The present invention has as its object a provision of a cassette control device by which high-speed processing can be expected even when an arithmetical unit with current processing capability is used, even in the case where cassettes for supplying electronic parts mountable on an electronic parts installation device increase in total number and the number of cassettes increases simultaneously with an increase in the number of nozzles which can suck electronic parts.

Further, the present invention has as its object the provision of an electronic parts installation device which can operate without interrupting packaging even when a disposal unit 12 for receiving discarded parts is filled.

A cassette control device of the present invention, which is provided in an electronic parts installation device and operates a plurality of cassettes according to the content of packaging, the electronic parts installation device holding target parts by using nozzles, carrying the parts to a printed board serving as a work, and mounting the parts thereon, the target parts being supplied to parts taking-out positions of the plurality of cassettes, the cassette control device comprising storage means having storage regions in which programs for respective operation patterns of the cassettes are set for each of the nozzles, and arithmetic means which recognizes a specific nozzle to be used from the nozzles, a specific cassette to be operated from the plurality of cassettes, and a specific operation pattern from the operation patterns based on a command inputted according to the content of packaging, extracts a specific program required for driving in the specific operation pattern from a specific region provided for the specific nozzle in the storage means, and operates the specific cassette using the specific program.

Further, a cassette control device of the present invention, which is provided in an electronic parts installations, device and operates a plurality of cassettes based on instruction information fed from a host controller according to the content of packaging, the electronic parts installation device including the host controller configured to hold target parts supplied to parts taking-out positions of the cassettes, carry the parts to a printed board serving as a work, and mount the parts thereon, characterized in that types of the connected cassettes are recognized and the types are notified to the host controller to contribute to generation of the instruction information. Further, the controller is characterized by outputting the same operation command to different kinds of cassettes. Moreover, the controller is characterized in that the types of cassettes are recognized when production is started and when the cassettes are changed.

A cassette of the present invention, which is provided in an electronic parts installation device and supplies target parts to parts taking-out positions, the electronic parts installation device holding the target parts by using nozzles, carrying the parts to a printed board serving as a work, and mounting the parts thereon, the cassette comprising a reel on which a carrier tape for storing target parts is set, a carrying/unpacking section for sending, the carrier tape to the parts taking-out positions from the reel and unpacking component storing parts of the carrier tape, an actuator for operating the carrying/unpacking section, and a microcomputer for operating the actuator based on an operation command from the outside, the microcomputer including a converting section for converting the operation command to match the actuator of the cassette.

An electronic parts installation device of the present invention, in which a controller is configured such that target parts supplied to parts taking-out positions are held by nozzles mounted on the head, the parts are carried to a printed board serving as a work, and the parts are mounted thereon, the device comprising a cassette group which is set to change a plurality of cassettes for supplying the target parts to the parts taking-out positions during packaging, a recognizing device for recognizing the images of the target parts held by the nozzles, and a disposal unit provided in the cassette group, characterized in that the controller is configured such that the nozzle holding a part to be discarded is driven to the position of the disposal unit based on information of the recognizing device so as to discard the part.

An electronic parts installation device of the present invention, in which a host controller is configured such that target parts supplied to parts taking-out positions are held, by nozzles mounted on the head, the parts are carried to a printed board, serving as a work, and the parts are mounted thereon, the device comprising a cassette group which, is set to change a plurality of cassettes for supplying the target parts to the parts taking-out positions during packaging, a cassette control device for driving the cassettes based on instruction information outputted from the host controller according to the content of packaging, a recognizing device for recognizing the images of the target parts held by the nozzles, and a disposal unit provided in the cassette group, characterized in that the cassette control device is configured to recognize the position of the disposal unit set in the cassette group and notify the host controller of the recognized position and the host controller is configured such that the nozzle holding a part to be discarded is driven to the position of the disposal unit based on information of the recognizing device so as to discard the part. Further, the device is characterized in that the cassettes and the disposal unit set in the cassette group is provided with a connector for connection to the cassette control device and the cassette control device is configured to recognize the positions of the cassettes and the disposal unit set in the cassette group. Moreover, the device is characterized in that the disposal unit is detachably set in the cassette group. Besides, the types of the cassettes are recognized when production is started and when the cassettes are changed.

A cassette of the present invention, which is provided in an electronic parts installation device and supplies target parts to parts taking-out positions, the electronic parts installation device holding the target parts by using nozzles, carrying the parts to a printed-board serving as a work, and mounting the parts thereon, the cassette comprising a reel on which a carrier tape for storing target parts is set, a carrying/unpacking section for sending the carrier tape to the parts taking out positions from the reel and unpacking component storing parts of the carrier tape, an actuator for operating the carrying/unpacking section, and sensor for detecting the shortage of remaining parts, characterized in that the microcomputer is configured to output the state of the sensor to the outside to make a notification about the shortage of remaining parts.

DESCRIPTION OF THE PREFERRED EMBODIMENTS

Figure 1:
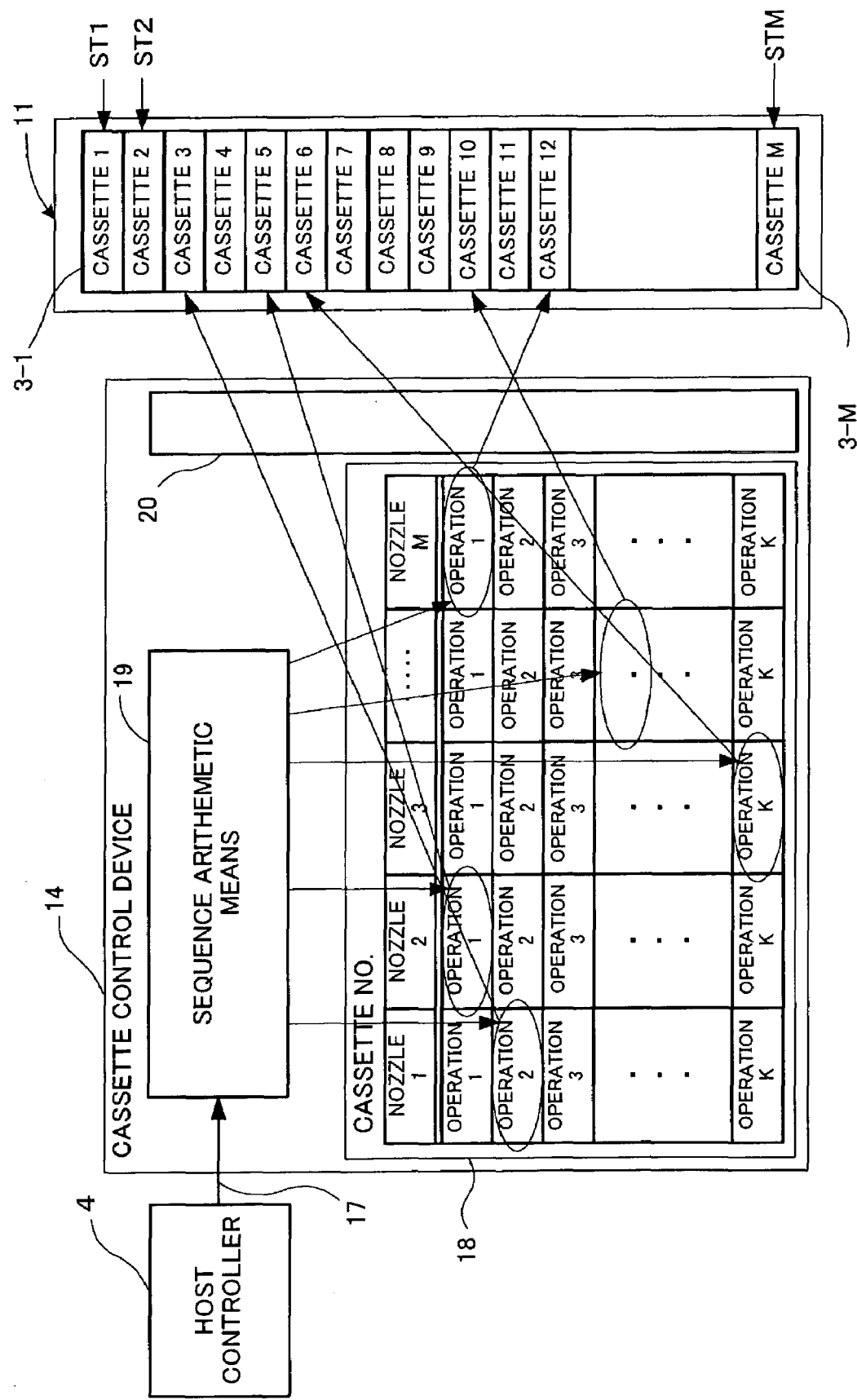
FIG. 1 is a structural diagram showing a cassette control device according to embodiment 1 of the present invention.

Referring to FIGS. 1 to 8, the following will discuss embodiments of the present invention. Members used commonly with the conventional art are indicated by the same reference numerals.

Embodiment 1

Figure 2:
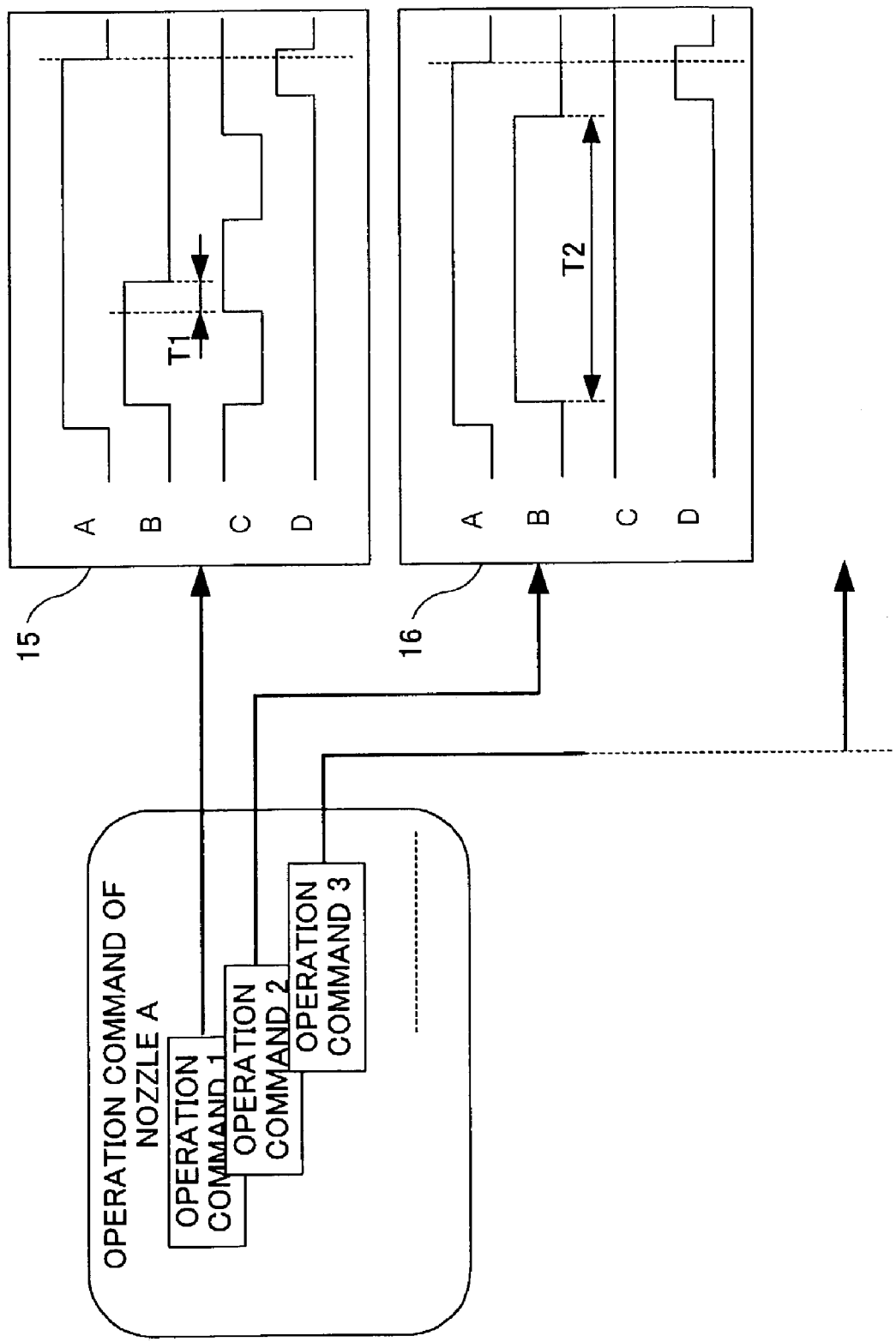
FIG. 2 is an explanatory drawing showing a command block for realizing different cassette operations according to the embodiment 1.

FIGS. 1 and 2 show the embodiment 1 of the present invention.

Figure 11:
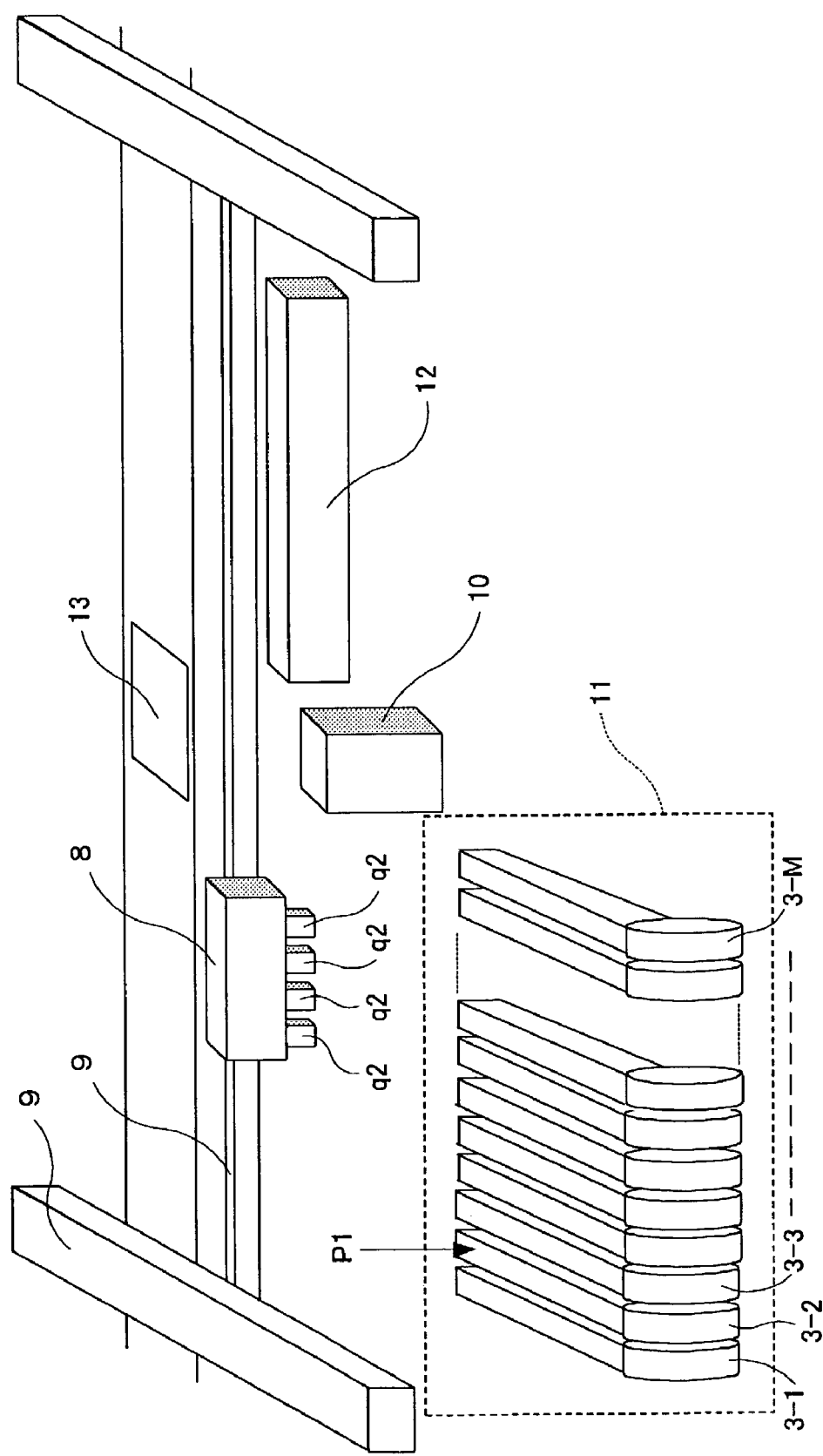
FIG. 11 is a structural diagram showing a conventional electronic parts installation device.

Besides, the entire configuration of an electronic parts installation device will be discussed referring to the conventional example of FIG. 11.

A cassette control device 14 of FIG. 1 is placed between a cassette group 11 and a host controller 4 for performing control to mount electronic parts on predetermined positions of the printed board 13, and the cassette control device 14 operates first to Mth cassettes (3-1) to (3-M) set on mounting positions of the cassette group 11 based on instruction information 17 from the host controller 4.

Additionally, a plurality (L) of sucking nozzles are provided on a head 8 of this embodiment of parts supplied to parts taking-out positions P1 of the cassettes (3-1) to (3-M), the sucking nozzles can suck and hold parts of the plurality, of adjacent cassettes (L≦M).

The contents of the instruction information 17 indicate which nozzle takes which cassette (specific cassette) in which operation pattern.

The cassette control device 2 is constituted by storage means 18, sequence arithmetic means 19 serving as arithmetic means, and a command area 20 provided for each cassette. In the storage means 18, an operation program is written for each of the plurality (L) of sucking nozzles. The program is required to operate cassettes of the first to Mth cassettes (3-1) to (3-M) that may suck parts. The sequence arithmetic means 19 recognizes sucking nozzles to operate based on the instruction information 17, reads operation programs required for each of the specific nozzles from the storage means 18, and specifies the programs for specific cassettes of the cassette group 11.

Besides, K operation programs (operation 1) to (operation K) required for cassette operations are respectively written in storage areas of nozzles 1 to L of the storage means 18. To be specific, the operation command for each selected nozzle No. includes a plurality of operation programs stored respectively for types of cassette operation as shown in FIG. 2. Signal groups 15, 16, and so on are an example of command timing for realizing operations of the plurality of cassettes. In the signal groups 15 and 16, reference character A denotes a signal indicating the start of a cassette operation, reference character B denotes a signal indicating on/off of a valve for operating the cassettes, reference character C denotes a signal indicating the state of a part transfer mechanism of the cassettes and reference character D denotes a signal indicating completion of a cassette operation. The signal group 15, and the signal group 16 perform different operations as follows: in the signal group 15, the signal B is turned on where the signal A is received, and the signal B is turned off at T1 after the first rising edge of C, and in contrast, in the signal group 16, the signal C does not change, and when the signal A is received, the signal B is turned on only during T2.

The sequence arithmetic means 19 recognizes nozzle No. corresponding to the operation command based on the instruction information 17, and for each of the operated sucking nozzles, the sequence arithmetic means 19 selects one of the plurality of operation commands for each nozzle No. stored in the storage means 18. To be specific, based on the stopping position of the head 8 in the cassette group 11 and the arranging positions of the sucking nozzles in the head 8, an operation command of the corresponding cassette is specified for each of the sucking nozzles, and the command is stored in the command area 20 for each of the first to Mth cassettes (3-1), (3-2), ..., and (3-M) of the cassette group 11. Thereafter, until the cassettes of the parts which can be sucked and held by the L sucking nozzles are changed in the cassette group 11, the sequence arithmetic means 19 reads the commands from the command area 20 and transmits the commands to the specific cassettes where electric parts are taken out every time an operation of each of the sucking nozzles is detected. The sequence arithmetic means 19 is configured such that L operations can be simultaneously performed in the series of operations on the cassette group 11 from the cassette control device 2.

In this way, K kinds of operation programs are written for each of the nozzle No. as to the cassettes, (3-1) to (3-M) which maybe used, and the sequence arithmetic means 19 supplies the operation programs, which are read based on the instruction information 17, to the cassette group 11. Thus, when the total number (=M) of the cassettes mounted in the cassette group 11 increases and operation programs required for the increased cassettes (3-M+1) are different from operation programs written in the storage areas of each of the nozzle No. of the storage means 18, it is only necessary to add one operation program of a new cassette in an area of each nozzle of the storage means 18. Every time one cassette increases, the capacity of the storage means 18 needs to increase only by (one operation program for a new cassette) *L. In the case of K>L, it is possible to reduce an increasing rate of the capacity of the storage means 18 as compared with the conventional storage means 16, in which K kinds of operation programs are held on each of the mounting positions of cassettes of the cassette group 11.

Further, in this case, even when the sequence arithmetic means 15 having low capability as the conventional art is adopted as the sequence arithmetic means 19, for example, only L*K scanning is necessary for storage areas of each of the operated sucking nozzles in the storage means 18. Thus, unlike the conventional art which scans a wide area of M*K, high-speed processing can be realized.

Additionally, the cylinder device of the conventional example maybe used as an actuator off the cassettes (3-1) to (3-M) of the embodiment 1, a motor may be used as an actuator, or a cassette having a cylinder device as an actuator and a cassette having a motor as an actuator may be mixed.

As with a cassette having a cylinder device as an actuator, two sensors a and b are provided in a cassette having a motor as a actuator. At the completion of transfer of parts in a carrying/unpacking section (5-2) after the motor is brought into conduction, when the first sensor a is turned on, the power supplied to the motor is turned off. At the completion of retrieval of parts after the power is turned off, the power is supplied to the motor again. When the carrying/unpacking section (5-2) returns to the original position, the second sensor b is turned on and the power to the motor is turned off, so that one operation is completed.

Embodiment 2

Figure 3:
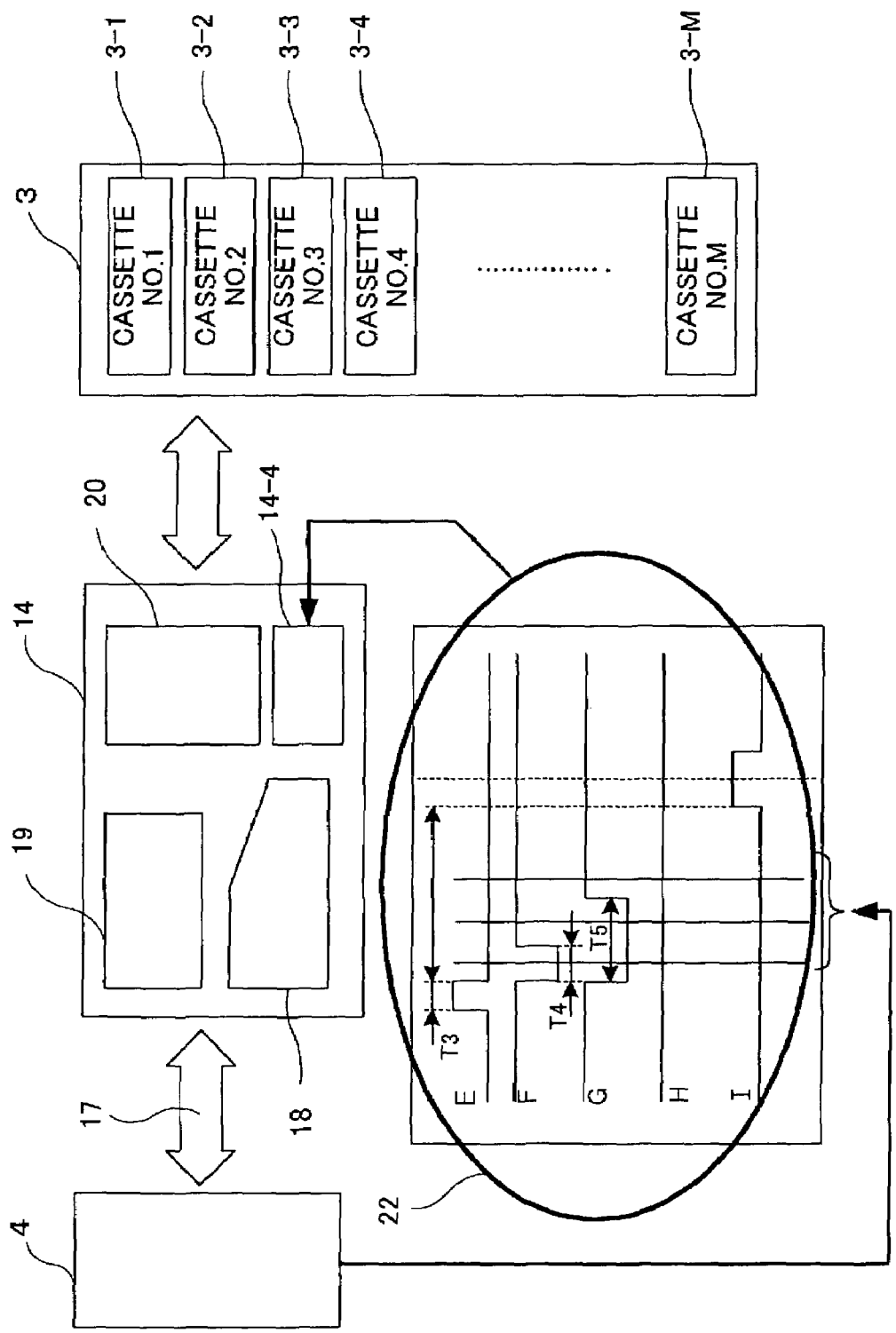
FIG. 3 is a structural diagram showing a cassette control device according to embodiment 2 of the present invention.

FIG. 3 shows a cassette control device according to the embodiment 2 of the present invention.

A cassette control device 14 of the embodiment 2 is different from that of the embodiment 1 in that two-way communication can be performed with cassettes which are set at mounting positions of a cassette group 11, a command area (14-4) is provided for identifying types of cassettes set in the cassette group 11, and the cassette control device 14 notifies a host computer 4 of types of cassettes (3-1) to (3-M).

Figure 4:
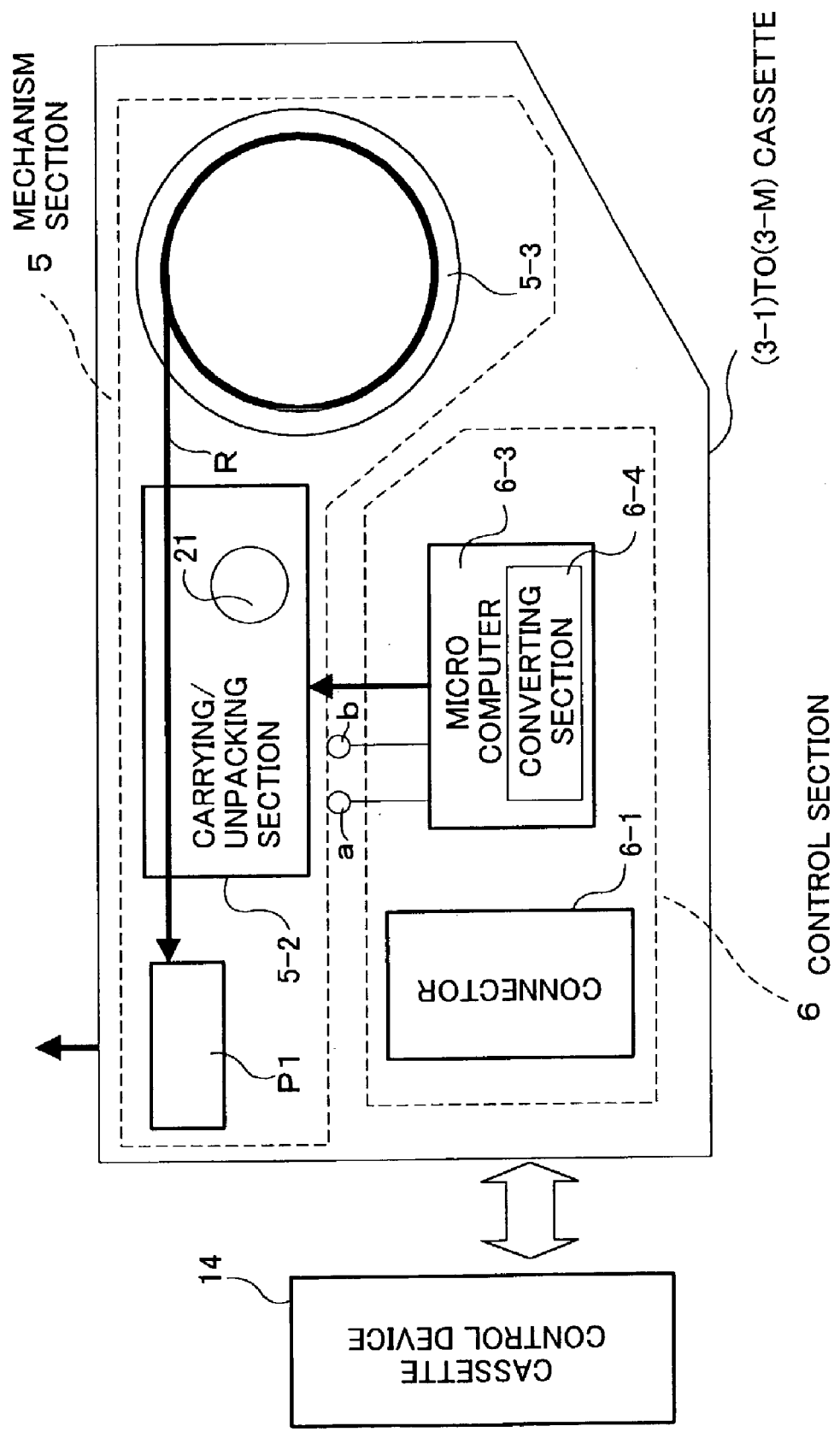
FIG. 4 is a structural diagram showing a cassette according to the embodiment 2.

Here, the types of cassettes indicate whether an actuator is a cylinder device or a motor. As shown in FIG. 4, a microcomputer (6-3) is mounted in a control section 6 of a cassette having a motor 21 as an actuator.

A signal E of an operation command 22 indicates a start of an operation and notifies all cassettes set in the cassette group 11 that identification is started. All of the cassettes (3-1) to (3-M) which have received the signal E transmit signals to the cassette control device 14 according to the types of cassettes. Signals F, G, and H respectively correspond to the types of cassettes. A signal I indicates completion of identification. The signals F, G, and H are subjected to poling by the host controller 4 at arbitrary timing, so that the types of cassettes can be identified.

With this configuration, an operator does not need to set manually in the host controller 4 information of cassettes set at mounting positions of the cassette group 11.

The host controller 4 recognizes the cassettes set at the mounting positions of the cassette group 11 based on the contents extracted by performing poling on the cassette control device 14, decides a nozzle taking out a target part from a cassette and determines a mounting position where the cassette is set based on a packaging program of the printed board 13, and outputs the decision to the cassette control device 14 as command information 17 before packaging.

Further, since the microcomputer (6-3) is mounted in the cassette having the motor as an actuator, the storage means 18 of the cassette control device 14 can be further reduced in capacity as will be discussed below.

When a cassette having a cylinder device as an actuator and a cassette having a motor as an actuator are provided, in the case of the cassette control device 14 of the embodiment 1, it is necessary to write an operation program for a cassette having a cylinder device as an actuator and another operation program for a cassette having a motor as an actuator. Meanwhile, in the case of the embodiment 2, only an operation program for a cassette having a cylinder device as an actuator is written and an operation program for a cassette having a motor as an actuator is not written in the storage means 18 of the cassette control device 14.

When the cassette control device 14 of the embodiment 2 receives the command information 17 for operating a cassette having a motor as an actuator from the host computer 4, the cassette control device 14 transmits a control program for a cylinder device to the corresponding cassette of the cassette group 11, the control program being selected from the storage means 18.

Since it has been found beforehand that the control program received from the cassette control device 14 is not suitable for driving the motor, in the cassette which has received the control program for a cylinder device, the received control program is converted to a program suitable for driving the motor by a conversion section (6-4) of the microcomputer (6-3), and the motor is properly operated using the converted program.

Besides, the signal E transmitted to the cassette control device 14 from the host computer 4 is outputted when production is started and the cassettes are changed. The host computer 4 automatically recognizes the types of cassettes via the cassette control device 14.

Moreover, when an operator manually inputs the content of cassettes set at the mounting positions of the cassette group 11, by comparing the content of the manual input with the types of cassettes at the start of packaging, the types being automatically recognized as described above, it is possible to detect an error of the manual input, When an error is detected in manual input, packaging is not started. Also in the case where a specified cassette is mounted on a mounting position specified based on a predetermined process chart, similarly, packaging is not started when an error is detected in mounting of cassettes.

Embodiment 3

Figure 5:
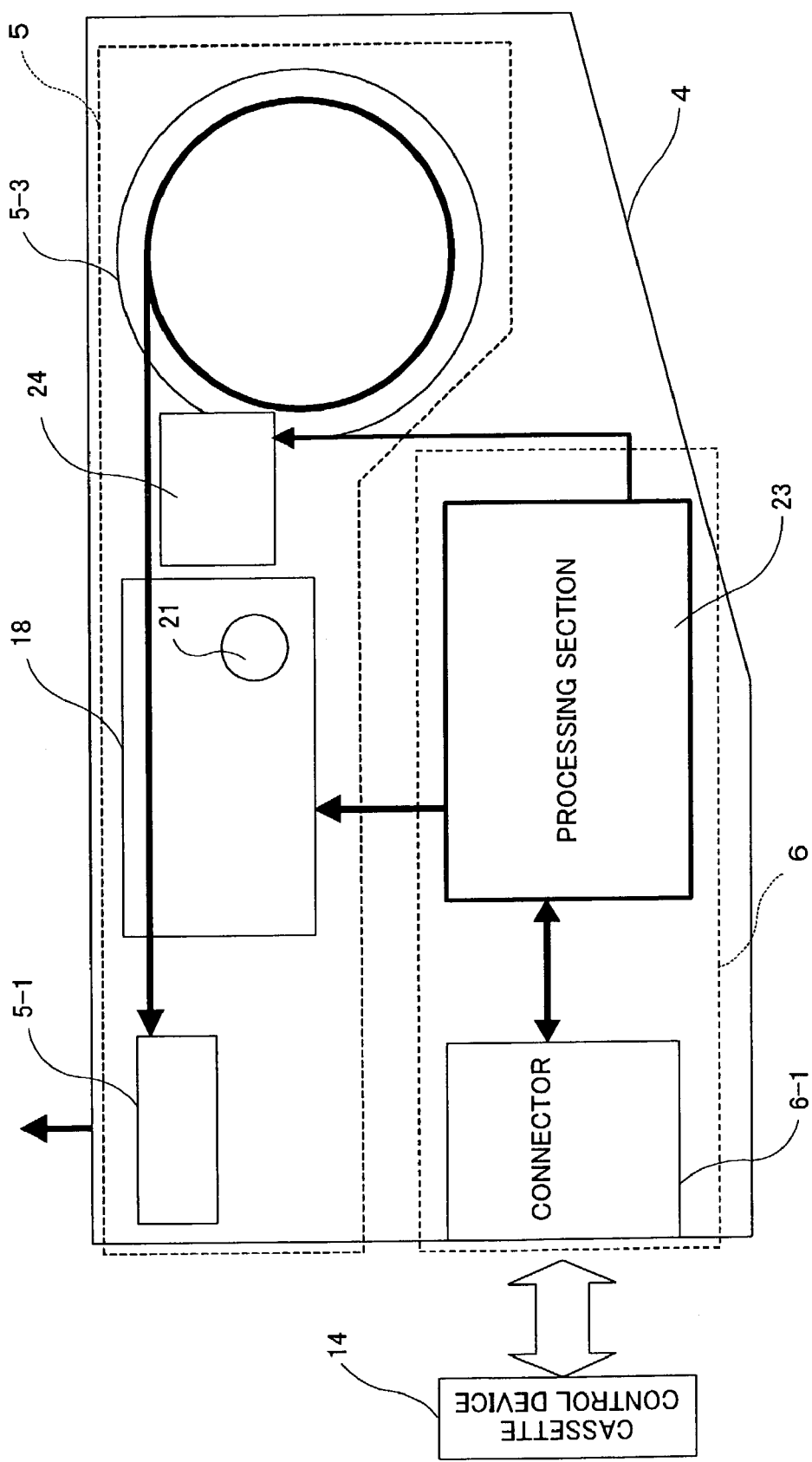
FIG. 5 is a structural diagram showing a cassette according to embodiment 3 of the present invention.
Figure 6:
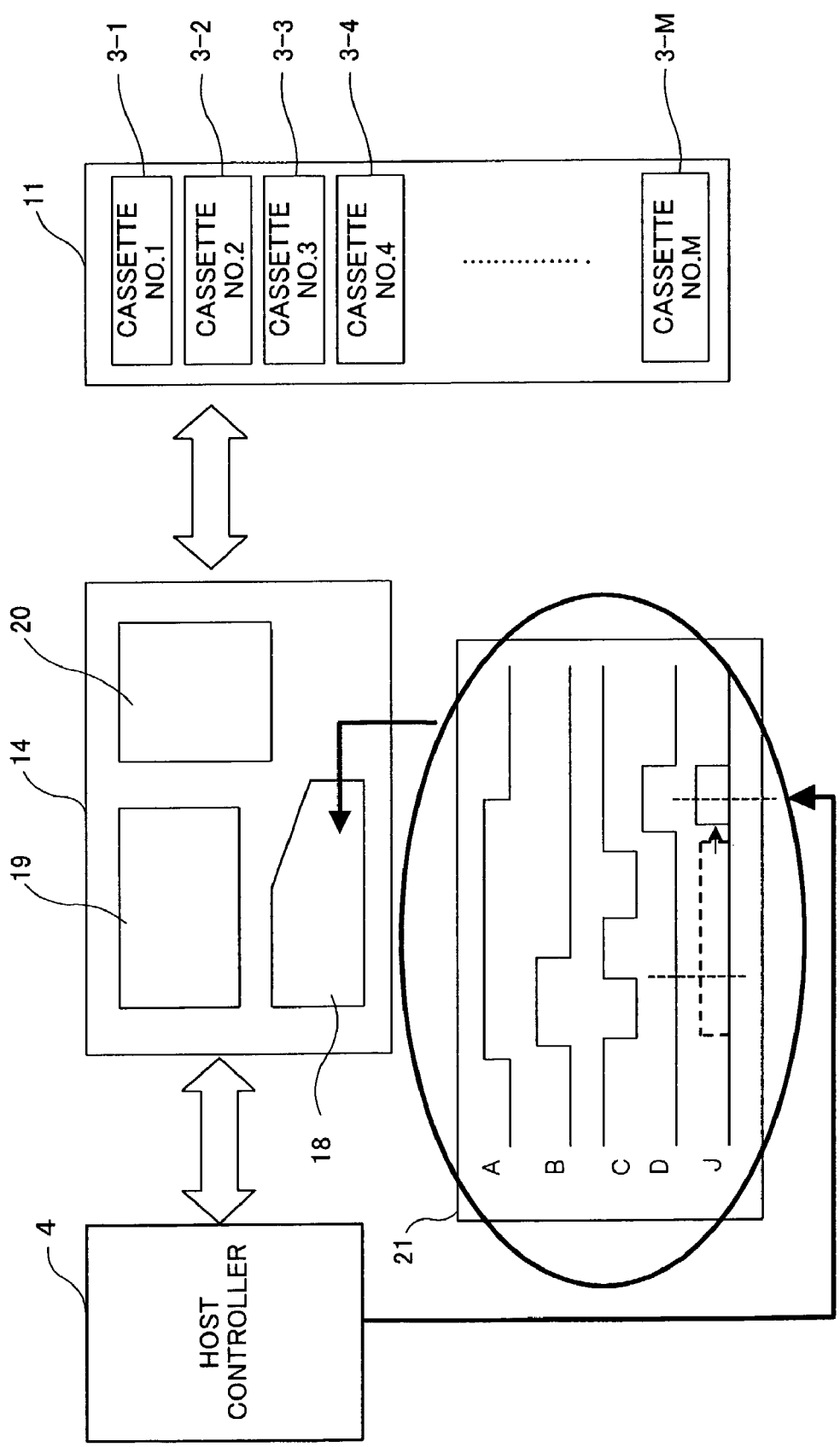
FIG. 6 is a structural diagram showing a cassette control device according to the embodiment 3.

FIGS. 5 and 6 show cassettes and a cassette control device according to the embodiment 3 of the present invention.

The cassette comprises a processing section 23 for performing motor control for controlling turning on/off of a motor, and a sensor 24 for detecting the number of remaining parts.

In an operation of the cassette, a feeding operation command of a motor is received in a connector (6-1) from a cassette control device 14, and a motor 21 is turned on/off. The timing of turning on/off the motor is adjusted by the processing section 23.

The processing section 23 stores a timer acting as software to turn on an arbitrary time motor. After a lapse of arbitrary time, the motor is turned off to complete the operation. At this moment, the processing section 23 for controlling turning on/off of the motor transmits and receives signals to and from the cassette control device as in the case of the signal group 15 of FIG. 2. Moreover, the processing section 23 detects a state of the sensor 24 during control of turning on/off of the motor 21. The sensor 24 is configured to detect an end of a carrier tape R, which is wound around a reel 5-3 and stores parts. When the number of remaining parts becomes small and the sensor 24 is turned on, the sensor 24 notifies the cassette control device 14 of the shortage of remaining parts.

In FIG. 6, the cassette control device 14 of the embodiment 3 stores an operation command 21 for detecting the number of remaining parts in storage means 18 having a plurality of commands for realizing different cassette operations. The operation command 21 indicates timing of inputting an input signal J of the sensor 24, in the operating timing of the cassette operating signal A, the valve on/off signal B, the part transfer mechanism signal C, and the cassette operation completing signal D of FIG. 2. The signal J is detected at a rising edge of the signal C. The result is transmitted to a host controller 4 when the operation completing signal D rises, so that it is possible to detect that the remaining parts mounted in the cassettes is reduced to a certain amount or less.

Embodiment 4

Figure 7:
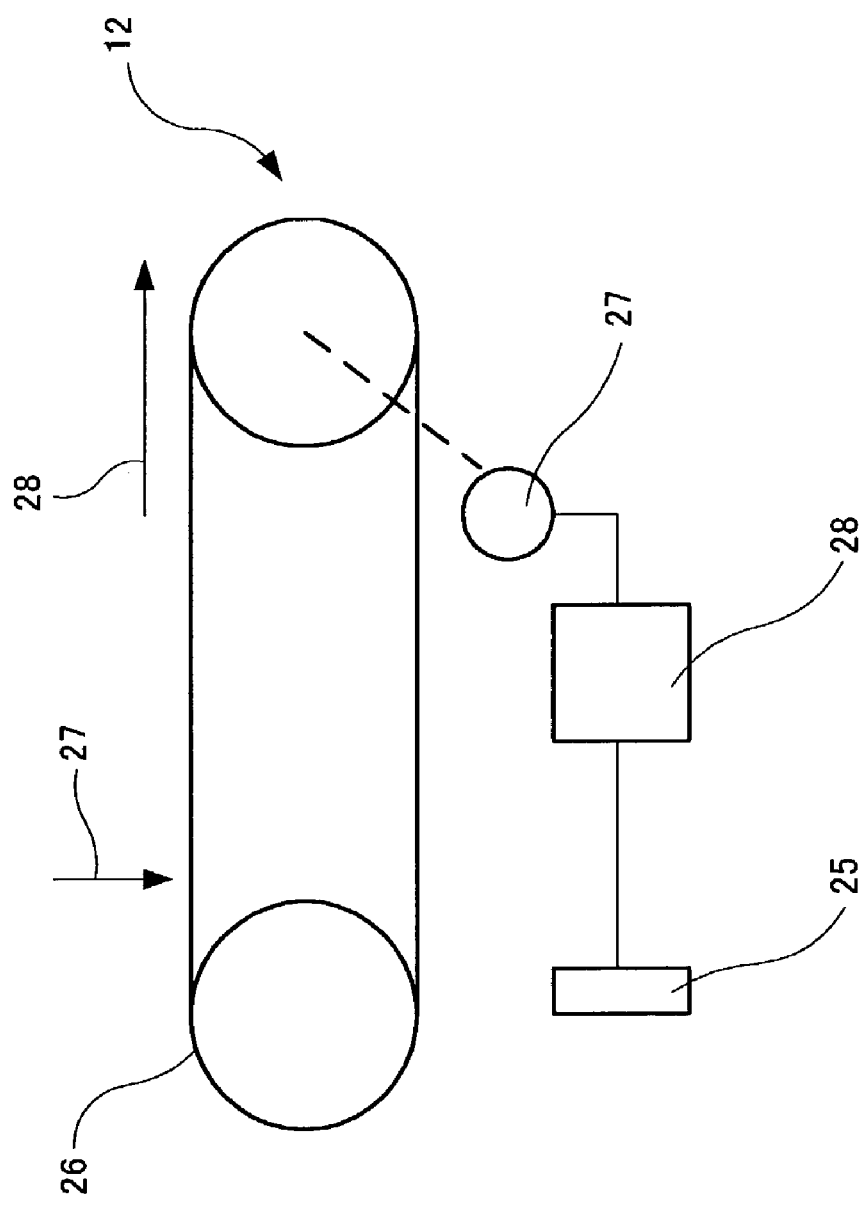
FIG. 7 is a structural diagram showing a disposal unit according to embodiment 4 of the present invention.
Figure 8:
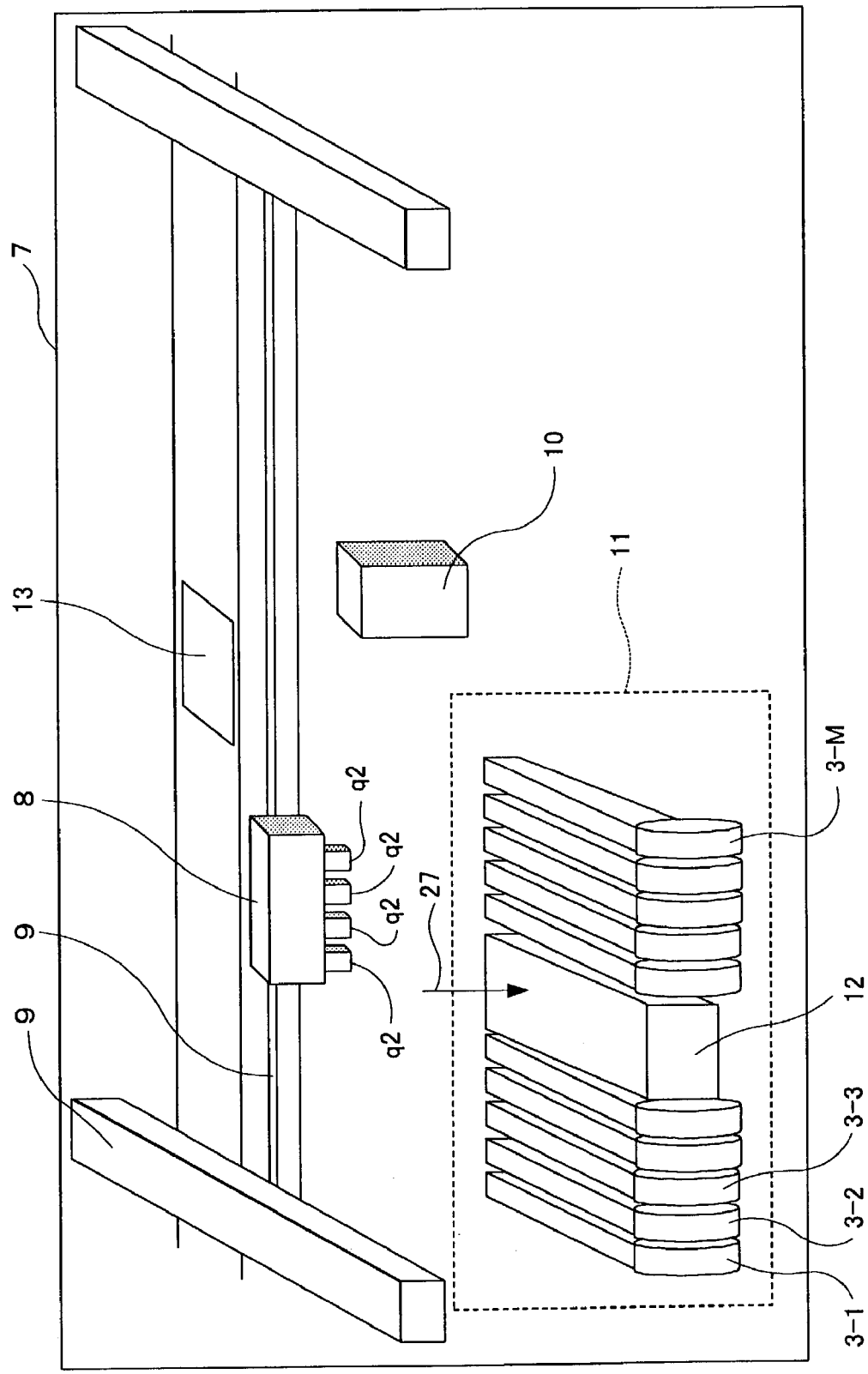
FIG. 8 is a structural diagram showing an electronic parts installation device according to the embodiment 4.
Figure 9:
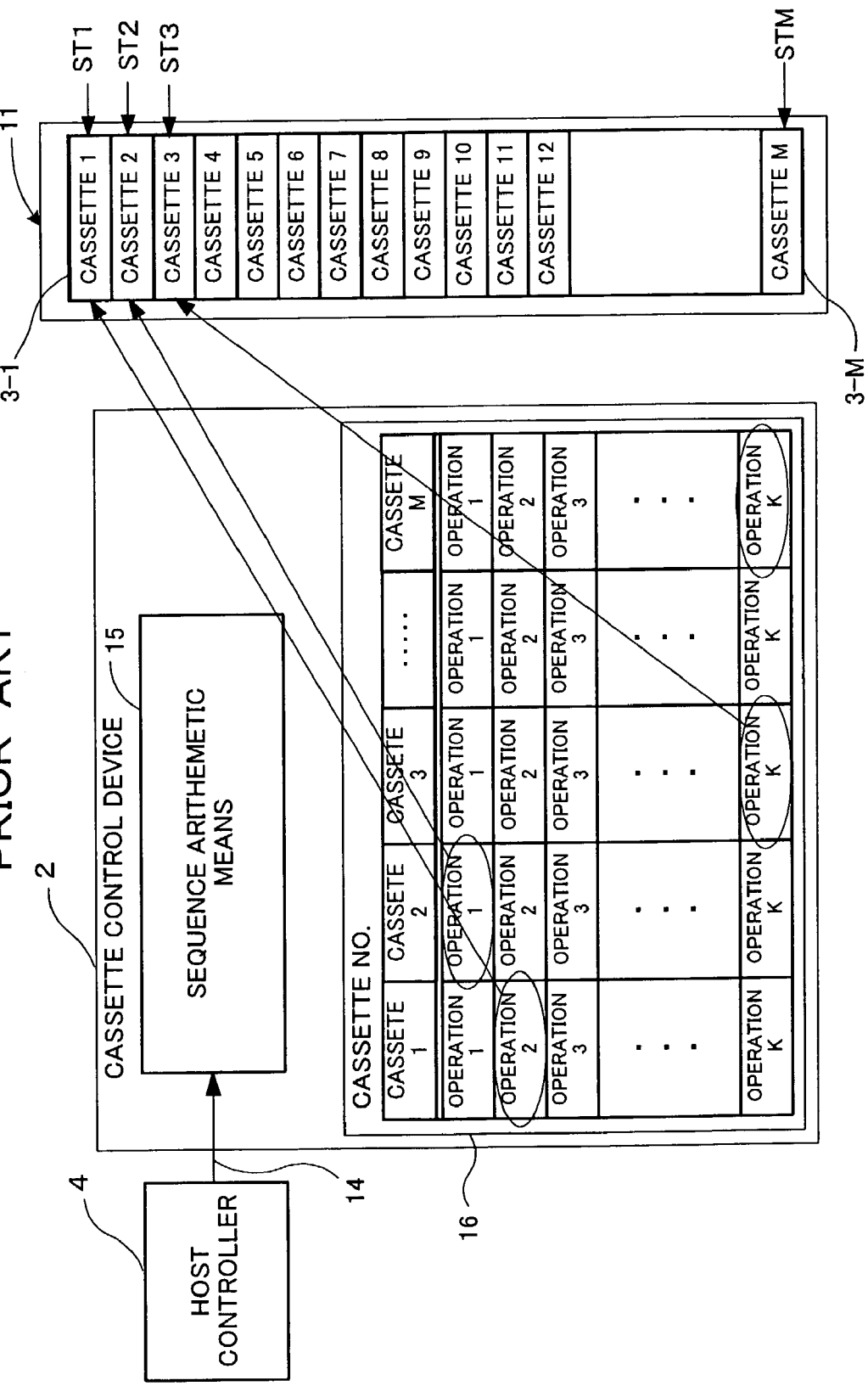
FIG. 9 is a structural diagram showing a conventional cassette control device.
Figure 10:
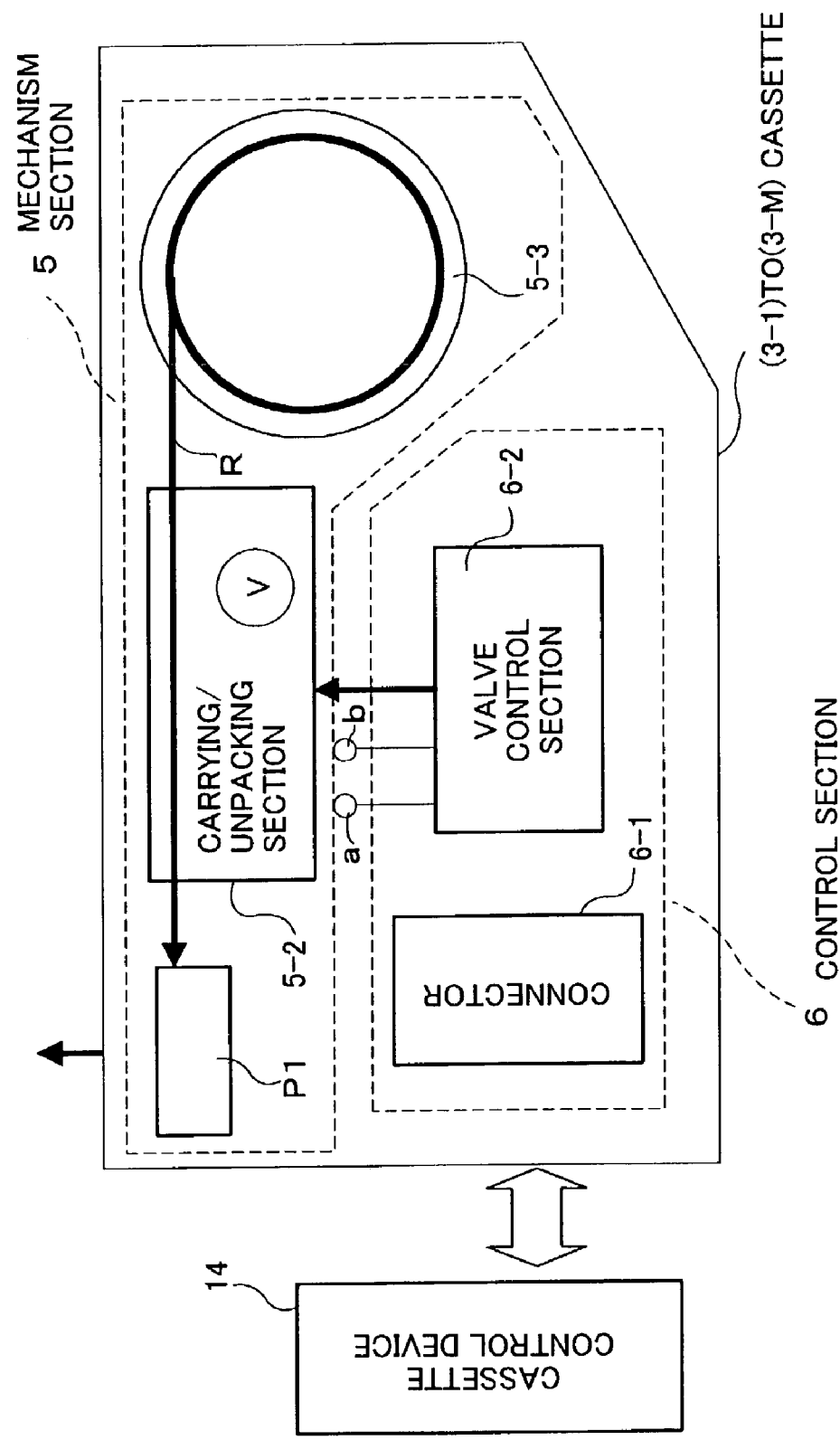
FIG. 10 is a structural diagram showing a conventional cassette.

FIGS. 7 and 8 show an electronic parts installation device according to the embodiment 4 of the present invention, which is different from the conventional example in that a disposal unit 12 for disposing of defective parts is set in a cassette ground.

Constituent elements having the same effects as those of the above embodiments are indicated by the same reference numerals in the following explanations.

In FIG. 8, the disposal unit 12 is set in the cassette group 11 in addition to the cassettes (3-1) to (3-M). The disposal unit 12 is set detachably from the cassette group 11 as with the cassettes (3-1) to (3-M).

As shown in FIG. 7, the disposal unit 12 is constituted by a connector 25, a conveyor 26 for carrying a received defective part in one direction, a motor 27 for driving the conveyor 26, and a control section 28.

The set disposal unit 12 is connected to a cassette control device 14 via the connector 25 as in the case of the cassettes (3-1) to (3-M) of the embodiment 2, and the mounting position of the disposal unit 12 in the cassette group 11 is recognized by a host controller 4 via the cassette control device 14.

As to an electric part sucked and held by a head 8, the attitude and shape before arrival at a target mounting position of a printed board 13 is confirmed by a recognizing device 10 during driving to carrying the part. When the electronic part sucked by a sucking nozzle is judged as being defective in shape, the head 8 is moved to the corresponding mounting position of the cassette group 11 in such a manner as to dispose of the defective part to the disposal unit 12 of the cassette group 11. When the defective part reaches above the disposal unit 12, sucking of the corresponding sucking nozzle is turned off to drop the defective part onto the conveyor 26 of the disposal unit 12 as indicated by an arrow 27.

Thereafter, in response to an instruction of the host controller 4, the motor 27 is operated by the control section 28 of the disposal unit 12 via the cassette control device 14, and the discarded defective part is carried to the outside of the electronic parts installation device (in the direction of the arrow 28).

In this way, the disposal unit 12 is, provided in the cassette group 11 in which cassettes can be readily changed from the outside of the electronic parts installation device. In the case where the disposal unit 12 is provided in the electronic parts installation device as with the conventional art, packaging needs to be stopped to collect discarded defective parts. In contrast to the conventional art, defective parts can be collected without stopping packaging in the present embodiment.

Further, the connector 25 is provided in the disposal unit 12 as with the cassettes (3-1) to (3-M) such that setting can be made at any mounting position of the cassette group 11, and the host controller 4 can recognize the mounting position via the cassette control device 14. Hence, the disposal unit 12 can be set at any of the mounting positions of the cassette group 11.

Besides, in the present embodiment, only one disposal unit 12 is set in the cassette group 11. A plurality of disposal units 12 may be set in the cassette 11 for driving.

As described above, according to the present invention, the total number of cassettes increases for supplying electronic parts mountable on the electronic parts installation device, and even in the case of an electronic parts installation device in which the number of cassettes increases simultaneously with an increase in the number of nozzles which can suck electronic parts, simply by increasing command areas each having a plurality of commands for realizing different cassette operations in areas for storing internal information, it is possible to reduce the influence on increased time to receive a command from a controller and perform a plurality of cassette operations. The controller performs control for mounting electronic parts on predetermined positions of a printed board.

Further, even in the event of an error in information registered by an operator before production, a production facility can automatically identify types of used cassettes from the mounted cassettes before production to detect an error of registered information beforehand Moreover, an operator can predict the number of remaining electronic parts from cassettes without confirming the total number of remaining parts, and can supply electronic parts before the electronic parts installation device is stopped.

Besides, a disposal unit is provided in a cassette group, and a cassette control device recognizes the mounting position of the disposal unit and notifies a host controller of the position, so that operability is improved and defective parts of the disposal unit can be collected without stopping any packaging.

What is claimed is:

1. An electronic parts installation device, in which a controller is configured such that a target part supplied to a parts taking-out position is held by a nozzle mounted on a head, and the part is carried to a printed board serving as a work and mounted thereon, comprising:
    a cassette group that is set to change a plurality of cassettes for supplying target parts to parts taking-out positions during packaging;
    a recognizing device for recognizing an image of the target part held by the nozzle; and
    a disposal unit provided in the cassette group,
    wherein said controller is configured such that the nozzle holding a part to be discarded is driven to a position of the disposal unit based on information of the recognizing device so as to discard the part.

2. The electronic parts installation device according to claim 1, wherein said disposal unit is set detachably in the cassette group.

3. An electronic parts installation device, in which a host controller is configured such that a target part supplied to a parts taking-out position is held by a nozzle mounted on a head, and the part is carried to a printed board serving as a work mounted thereon, comprising:
    a cassette group that is set to change a plurality of cassettes for supplying target parts to parts taking-out positions during packaging;
    a cassette control device for driving the cassettes based on instruction information outputted from the host controller according to the content of packaging;
    a recognizing device for recognizing an image of the target part held by the nozzle; and
    a disposal unit provided in the cassette group,
    wherein said cassette control device is configured to recognize a position of the disposal unit set in the cassette group and notify the host controller of the position, and the host controller is configured such that the nozzle holding a part to be discarded is driven to the recognized position of the disposal unit based on information of the recognizing device so as to discard the part.

4. The electronic parts installation device according to claim 3, wherein a connector for connection to the cassette control device is provided for the cassettes and the disposal unit set in the cassette group, and the cassette control device is configured to recognize a position of the cassette and the position of the disposal unit set in the cassette group.

5. The electronic parts installation device according to claim 3, wherein a type of the cassettes is identified when production is started and when the cassettes are changed.

* * * * *